US 6,714,411 B2

(12) United States Patent
Thompson et al.

(10) Patent No.: US 6,714,411 B2
(45) Date of Patent: Mar. 30, 2004

(54) COMPUTER SERVER HOT PLUG FAN TRAY ASSEMBLY AND METHOD OF FAN REMOVAL

(75) Inventors: Daniel T. Thompson, Houston, TX (US); Kevin Conn, Magnolia, TX (US); Erik Robert Nielsen, Houston, TX (US); Robert J. Hastings, Spring, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/038,799

(22) Filed: Dec. 31, 2001

(65) Prior Publication Data

US 2003/0123222 A1 Jul. 3, 2003

(51) Int. Cl.$^7$ ................................................. H05K 7/20
(52) U.S. Cl. .................. 361/695; 361/690; 361/694; 174/16.1; 165/104.33; 165/122; 454/184
(58) Field of Search ................ 361/683–687, 361/688, 692–695, 721, 724, 727; 165/101, 104.32, 104.33, 104.34, 185; 312/236, 298, 350, 136; 415/178, 213.1, 214.1; 459/184; 412/423.7, 360, 423.5; 178/15.1–16.1; 416/247 R; 369/75.1; 340/635

(56) References Cited

U.S. PATENT DOCUMENTS

| 4,356,531 A | * | 10/1982 | Marino et al. ............... 361/683 |
| 4,767,262 A | * | 8/1988 | Simon ........................... 415/119 |
| 5,788,467 A | * | 8/1998 | Zenitani et al. ............. 417/360 |
| 5,793,608 A | * | 8/1998 | Winick et al. ............... 361/695 |
| 6,031,717 A | * | 2/2000 | Baddour et al. ............ 361/667 |
| 6,031,719 A | * | 2/2000 | Schmitt et al. ............. 361/695 |
| 6,071,082 A | * | 6/2000 | Lecinski et al. ............ 417/53 |
| 6,115,250 A | * | 9/2000 | Schmitt ....................... 361/695 |
| 6,168,396 B1 | * | 1/2001 | Homola ................. 417/423.14 |
| 6,236,564 B1 | * | 5/2001 | Fan .............................. 361/695 |
| 6,288,897 B1 | * | 9/2001 | Fritschle et al. ........... 361/687 |
| 6,310,770 B1 | * | 10/2001 | Negishi ...................... 361/695 |
| 6,317,320 B1 | * | 11/2001 | Cosley et al. .............. 361/695 |
| 6,388,880 B1 | * | 5/2002 | El-Ghobashy et al. ...... 361/695 |
| 6,392,872 B1 | * | 5/2002 | Doustou et al. ............ 361/681 |
| 6,392,893 B1 | * | 5/2002 | Carney et al. .............. 361/727 |
| 6,414,845 B2 | * | 7/2002 | Bonet .......................... 361/695 |
| 6,504,715 B2 | * | 1/2003 | Ota et al. .................... 361/695 |
| 6,556,437 B1 | * | 4/2003 | El-Ghobashy et al. ...... 361/695 |

FOREIGN PATENT DOCUMENTS

| JP | 409199881 A | * | 7/1997 | ............ H05K/7/20 |
| JP | 411346078 A | * | 12/1999 | ............ H05K/7/20 |
| JP | 02000340975 A | * | 12/2000 | ............ H05K/7/20 |
| JP | 02001177281 A | * | 6/2001 | ............ H05K/7/20 |

* cited by examiner

Primary Examiner—Michael Datskovskiy

(57) ABSTRACT

The present invention is a fan tray assembly in a computer chassis which allows fan assemblies to be removed and installed without shutting down the computer device. The fan tray assembly includes two or more fan assemblies for cooling the interior of the chassis. The fan tray assembly has a first position in which the fan tray assembly is received in the chassis and an extended position in which the fan tray assembly extends from an opening in the chassis. The fan tray assembly has an end plate, a left side, and a right side, and at least one of the sides includes one or more slots for receiving a fan assembly. A hot tap board mounted to the fan tray assembly is connected to a power cable. The fan assemblies are hot tap connected to the hot tap board. The present invention allows the fan assembly to be removed without shutting down the device by extending the fan tray assembly from the computer chassis and removing the fan assembly from the fan tray assembly. A replacement fan assembly is inserted in the slot in the fan tray assembly and the fan tray assembly is slid back into the computer chassis.

12 Claims, 4 Drawing Sheets

COMPUTER SERVER HOT PLUG FAN TRAY ASSEMBLY AND METHOD OF FAN REMOVAL

CROSS-REFERENCE TO RELATED APPLICATIONS

None.

STATEMENTS REGARDING FEDERALLY SPONSORED RESEARCH OR DEVELOPMENT

Not applicable.

REFERENCE TO A MICROFICHE APPENDIX

Not applicable.

BACKGROUND OF THE INVENTION

1. Field of the Invention

The present invention relates generally to fans in computers, and more particularly to the installation and removal of fans in computer servers.

2. Description of the Related Art

It is well known in the field of personal computers and related components, such as servers, to include two or more fans for removing the heat from the interior of the components. Oftentimes, two or more fans are installed for purposes of redundancy in the event one fan fails.

One problem that exists is access to the fan in the server or computer when service or replacement is needed. It is known to install fans using a "hot tap plug." A hot tap plug is a blind mating connector wherein the electrical connection is made upon the placement of the fan or other device into its final position.

Quite often multiple servers are closely stacked in a standing server rack. There is limited space in a rack environment. Existing hot plug fans require removal of the server chassis from the rack environment and/or removal of a top cover of the server chassis to facilitate changing a hot plug fan. This is inconvenient and impractical, in addition to being time consuming. Additionally, the process of changing out a fan typically requires shutting down the device while the servicing is being conducted.

It is desirable to have an assembly adapted for the easy removal and/or installation of fans in the computer, particularly a server. It is desirable that access to the fans is convenient, practical and requires little time, even in devices which are in a rack environment. Further, it is desirable that servicing of the fans be accomplished without shutting down the server or other such device.

BRIEF SUMMARY OF THE INVENTION

The present invention is an assembly adapted for the easy removal and/or installation of fans in the computer, particularly a server. The present invention provides fan access that is convenient, practical and requires little time, even in devices which are in a rack environment. Further, the present invention allows fan servicing (removal and installation) while the server or other such device continues to run without shutting the device down.

The present invention is a fan tray assembly which can be pulled out from the rear of the server without having to remove the top cover or pull the server out of the rack. Additionally, the fan tray assembly can be pulled out from the rear of the server while retaining the server's functionality.

The fan tray assembly includes fan assembly slots, each slot for receiving a fan assembly. In the preferred embodiment of the invention, a hot tap plug is used to provide power to the fan assembly. Preferably, the fan tray assembly includes a hot tap board providing the hot tap plug with the fan assembly when the fan assembly is fully installed in the fan slot. Preferably, a power cable has a first end connected to the hot tap board and a second end connected to a system board, preferably a stationary system board. The power cable is long enough to maintain the supply of power to the hot tap board even when the fan tray assembly is fully extended.

In the preferred embodiment of the present invention, the fan assemblies are removed and installed from the sides of the fan tray assembly. Additionally, in the preferred embodiment, the placement of the fan tray assembly in the server chassis is generally centrally located with respect to the left and right sides of the server. Further, in the preferred embodiment, the fan assemblies can be removed from the fan tray assembly without extending outwardly beyond the sides of the server chassis. Thus, the required service is accomplished without any encroachment on the space above or below the server, and only access to the rear of the server is required.

Another feature of the preferred embodiment is that the fan tray assembly includes two pairs of fan assemblies, one pair accessed from the right side and one pair accessed from the left side of the fan tray assembly. The fan tray assembly is designed to allow unrestricted air flow from within the chassis with the fan tray assembly in the installed position. Additionally, the fan tray assembly permits air flow even when in the extended position. Thus, even when the fan tray assembly is in the extended position, the operating fans continue to pull the heated air out of the chassis.

BRIEF DESCRIPTION OF THE SEVERAL VIEWS OF THE DRAWINGS

In order to more fully understand the drawings referred to in the detailed description of the invention, a brief description of each drawing is presented, in which.

DETAILED DESCRIPTION OF THE INVENTION

Figure 1:
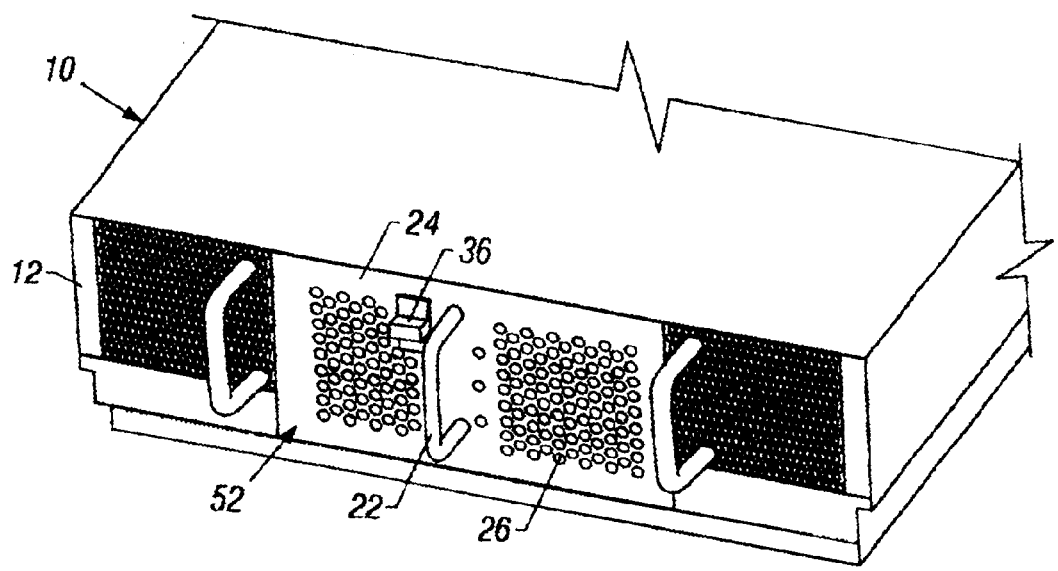
FIG. 1 is a top, rear and left-side perspective view of a chassis having a fan tray assembly according to the present invention.
Figure 2:
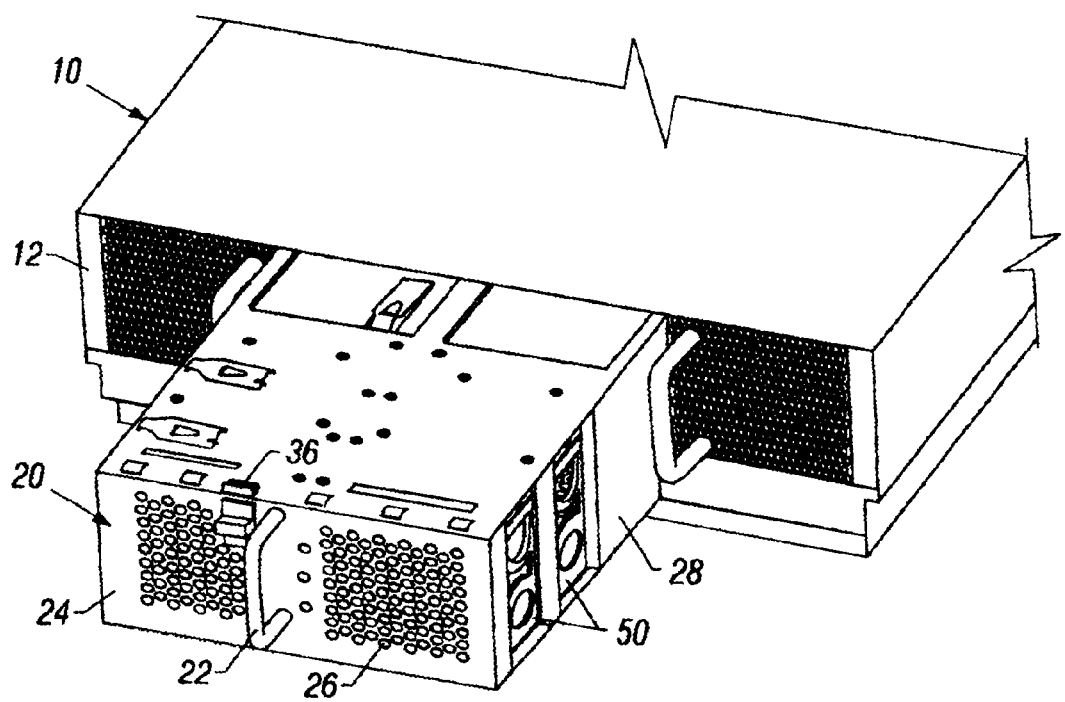
FIG. 2 is a view similar to FIG. 1 with the fan tray assembly in an extended position.
Figure 3:
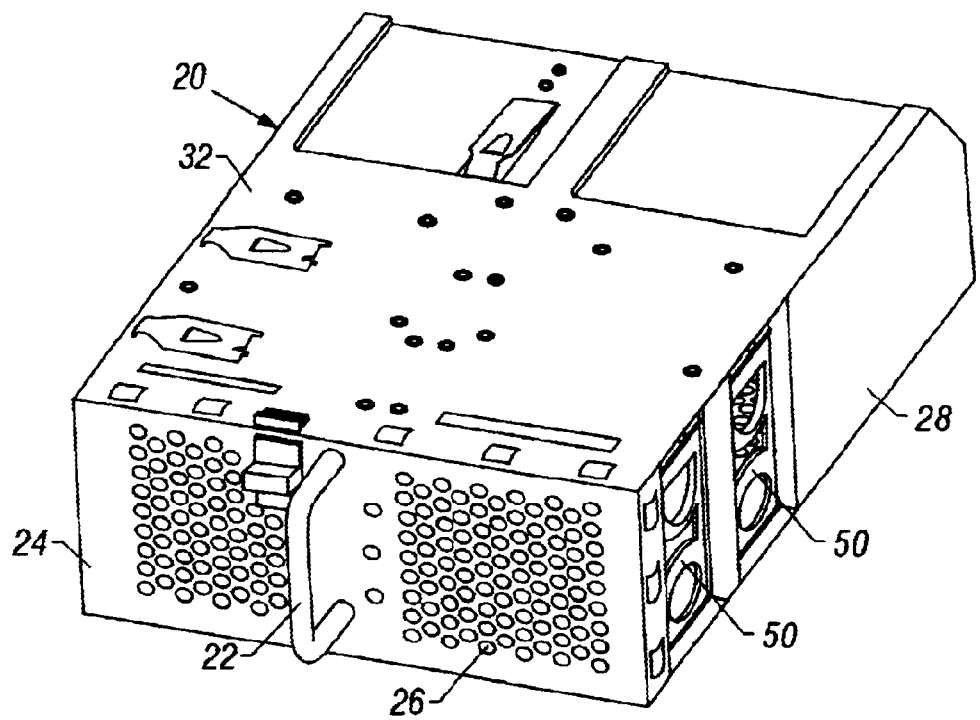
FIG. 3 is a top, rear and left-side perspective view of a fan tray assembly with two fan assemblies installed in the left-side of the fan tray assembly according to a first embodiment of the present invention.

The present invention will now be described in greater detail with specific reference to the drawings. The present invention is a fan tray assembly, generally referred to as 20, which is incorporated into a chassis 10 of a computer server or other device as shown in FIGS. 1 and 2. As shown in FIG. 2, the fan tray assembly 20 can be pulled out from the rear 12 of the server without removing the top cover or pulling the server out of the rack if in a rack. Additionally, it is to be understood that the fan tray assembly 20 can be pulled out from the rear 12 of the server while retaining the server's functionality.

Figure 7:
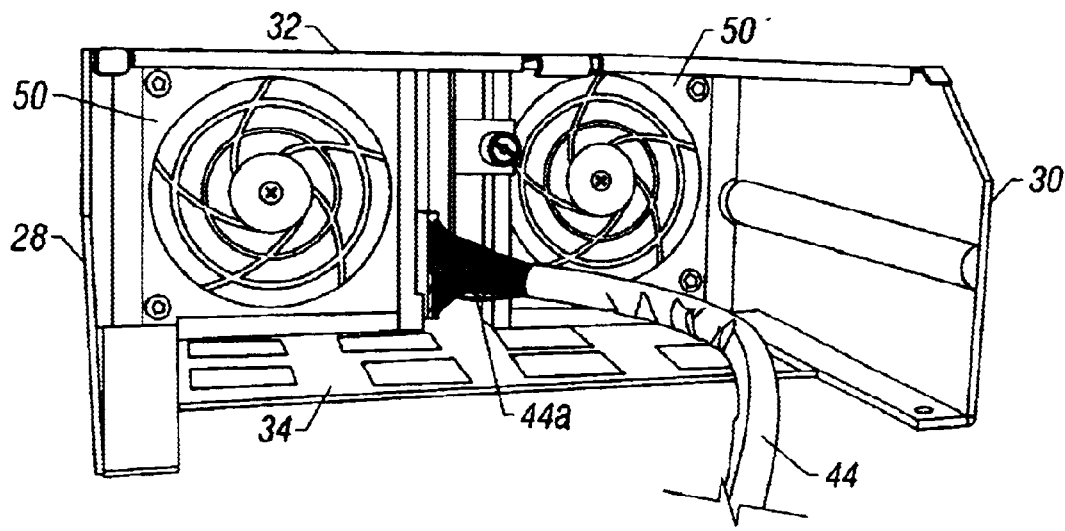
FIG. 7 is a front elevation view of the fan tray assembly showing a power cable connecting a hot tap board, a fan assembly installed on each side of the hot tap board.
Figure 8:
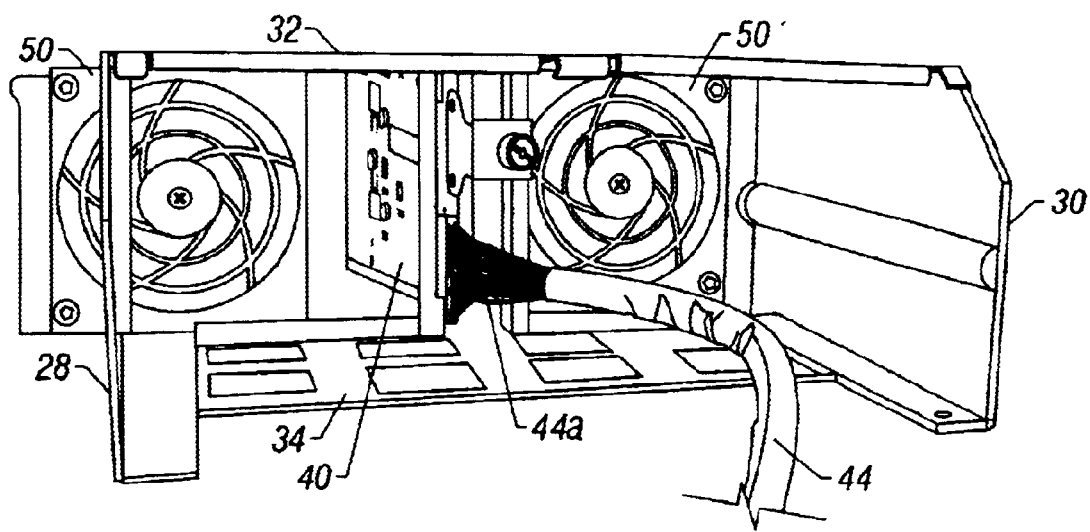
FIG. 8 is a view similar to FIG. 7 with one fan assembly partially installed and one fan assembly installed.

Referring to FIGS. 1–4, the fan tray assembly 20 includes a handle 22 for pulling the fan tray assembly 20 to its extended position from the rear 12 of the chassis 10. The handle 22 is attached to a rear foraminous plate 24. The rear plate 24 includes a plurality of holes or openings 26 to allow air to flow therethrough. As will be explained below, the fan assemblies 50 force hot air out of the rear 12 of the chassis 10 through the rear plate 24. The fan tray assembly 20 also includes a left side 28, right side 30 (FIGS. 7 and 8), top 32, and bottom 34 (FIGS. 7 and 8). Preferably, the fan tray assembly 20 does not include a front panel so that air flow is not obstructed. As shown in FIGS. 7 and 8, the bottom 34 preferably is foraminous, perforated, or slotted to allow air flow and cool a board (not shown) located beneath the bottom 34. Although not shown, the sides 28 and 30 could also include openings for air flow if necessary or desirable.

Referring to FIG. 2, the fan tray assembly 20 slides in and out of the rear 12 of the chassis 10. Although not shown in the drawings, it is to be understood that various types of slide mechanisms or techniques can be used to permit the sliding action of fan tray assembly 20 relative to the chassis 10.

As shown in FIGS. 1 and 2, in the preferred embodiment of the invention the fan tray assembly 20 includes a latch mechanism 36 accessible at the rear plate 24 for permitting the release and extension of the fan tray assembly 20 from the chassis 10. It is to be understood that various types of latch mechanisms 36 would be readily apparent to persons of ordinary skill in the art.

Figure 4:
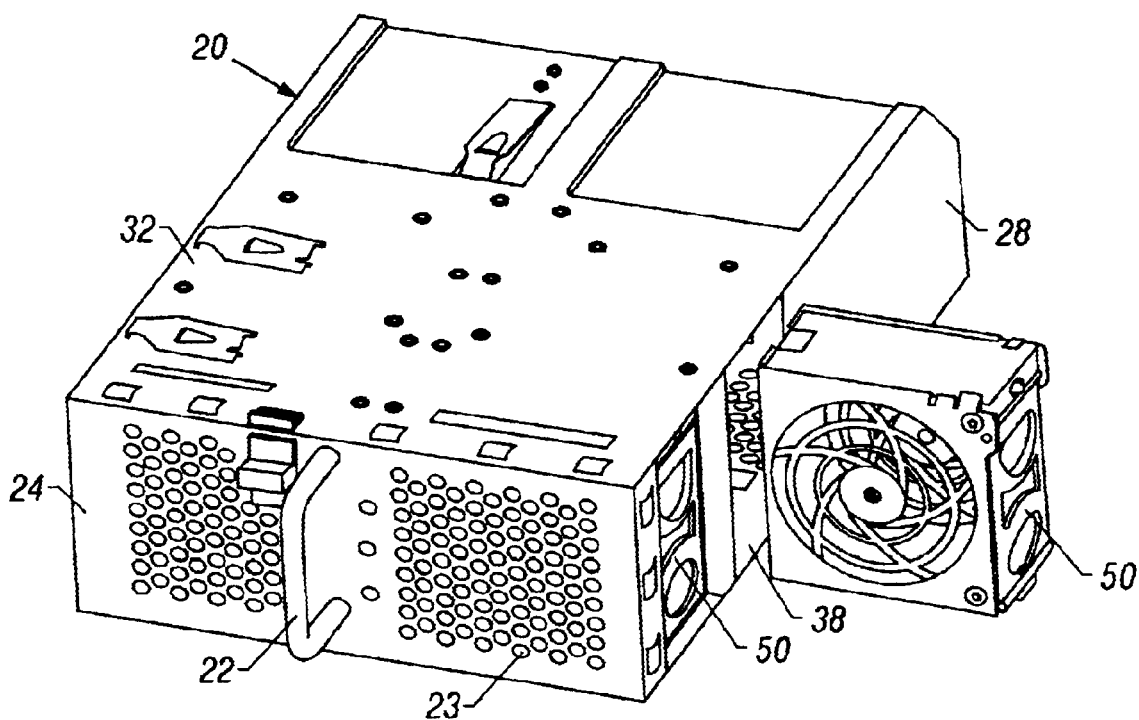
FIG. 4 is a view similar to FIG. 3, showing one fan assembly installed and one fan assembly removed from the left-side of the fan tray assembly.

Referring to FIGS. 3–6, the fan tray assembly 20 includes a plurality of fan assembly slots 38. Each slot 38 receives a fan assembly 50. The number of fan assemblies 50 will vary depending upon the specific application and desired redundancy. Typically, a server will include four fan assemblies 50. Although not clearly shown, it is to be understood that in the attached drawings, the illustrated fan tray assembly 20 includes a pair of fan assemblies 50 on the left side 28 and a pair of fan assemblies 50' (FIGS. 7 and 8) on the right side 30. For purposes of simplification, it is to be understood that discussion of fan assemblies 50 applies equally to the fan assemblies 50'. As shown in FIGS. 4 and 8, the fan assembly 50 slides into the slot 38. It is to be understood that the fan assembly 50 preferably includes a catch for securing the fan assembly 50 in the slot 38 upon being fully inserted. Suitable catches are well known to those skilled in the art.

Figure 5:
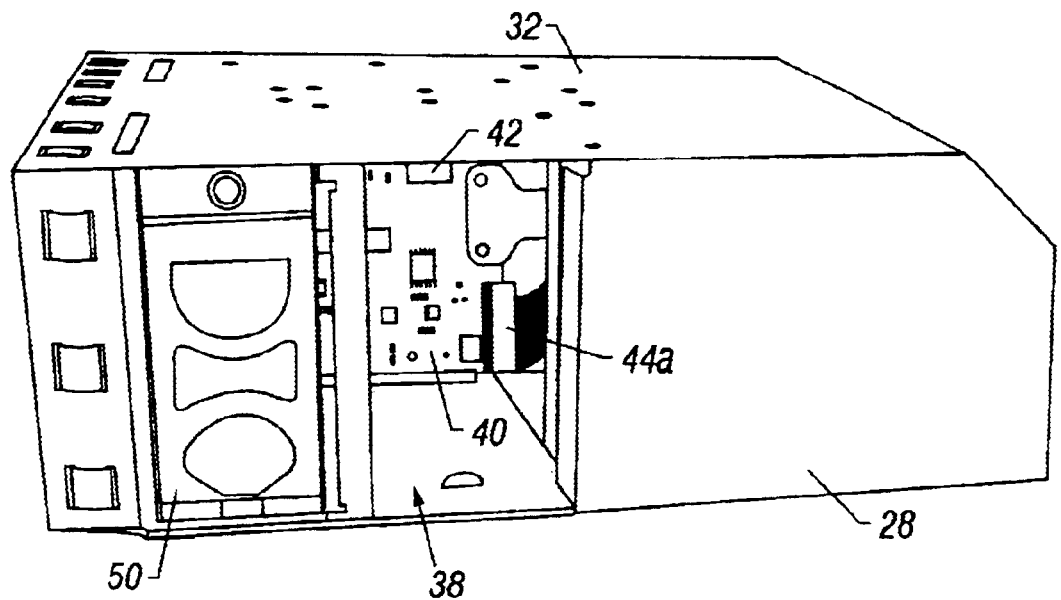
FIG. 5 is a left-side elevation view of the fan tray assembly with one fan assembly installed and one fan assembly removed.
Figure 6:
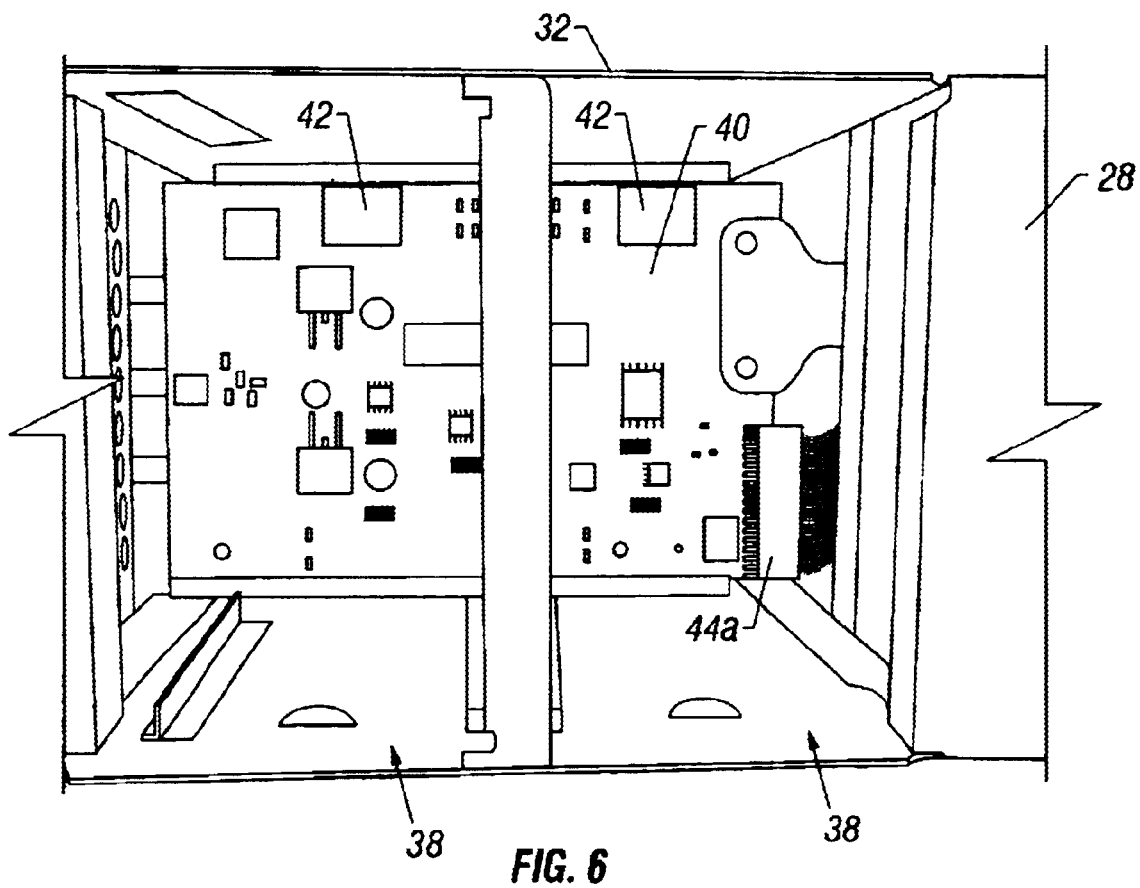
FIG. 6 is an enlarged partial side elevation view of the fan slots in the fan tray assembly.

In the preferred embodiment of the invention, a hot tap plug 42 is used to provide power to the fan assembly 50. Referring to FIGS. 5, 6 and 8, the fan tray assembly 20 preferably includes a hot tap board 40 providing the hot tap plug 42 with the fan assembly 50 when the fan assembly 50 is fully inserted in the fan slot 38. Preferably, a power cable 44 has a first end 44a connected to the hot tap board 40 and a second end (not shown) connected to a system board (not shown), preferably a stationary system board. The power cable 44 has a length sufficient to maintain the supply of power to the hot tap board 40 even when the fan tray assembly 20 is fully extended as shown in FIG. 2.

In the preferred embodiment of the present invention, the fan assemblies 50 are removed and installed from the sides 28, 30 of the fan tray assembly 20 as shown in FIGS. 2, 4, and 8. Additionally, in the preferred embodiment, the placement of the fan tray assembly 20 in the server chassis 10 is generally centrally located with respect to the left and right sides, 28 and 30 respectively, of the server as shown in FIGS. 1 and 2. Further, in the preferred embodiment, the fan assemblies 50 can be removed from the fan tray assembly 20 without extending outwardly beyond the sides 28 and 30 of the server chassis 10. Thus, the required service is accomplished without any encroachment on the space above or below the server, and only access to the rear of the server is required.

As discussed above with respect to the illustrated preferred embodiment, the fan tray assembly 20 includes one pair of fan assemblies 50' accessed from the right side 30 and one pair of fan assemblies 50 accessed from the left side 28 of the fan tray assembly 20. The fan tray assembly 20 is designed to allow unrestricted air flow from within the chassis 10 with the fan tray assembly 20 in its installed position. Additionally, the fan tray assembly 20 permits air flow even when in its extended position as shown in FIG. 2. Since the server does not need to be shut down to remove or replace any inoperative fan assembly 50, even when the fan tray assembly 20 is in the extended position, the operating fans 50, 50' continue to pull heated air out of the chassis 10 and cool the server while the inoperative fan assembly is being replaced.

It is to be understood that the present invention is particularly well suited for use in servers mounted in a rack. The present invention allows one to quickly and easily change out a fan assembly 50 in a rack-mounted server from the rear of the server. Although the invention has been described with respect to the fan tray assembly 20 extending from the rear 12 of the chassis 10, it is to be understood that the fan tray assembly 20 could also be incorporated in the front of the chassis, if desired. Preferably, the fan assemblies 50 mount from the sides 28 and 30 to enable access while the server is still in the rack.

The foregoing disclosure and description of the invention are illustrative and explanatory thereof, and various changes in the details of the illustrated apparatus and construction and method of operation may be made without departing from the spirit of the invention.

We claim:

1. In a computer chassis including a plurality of fan assemblies for cooling the interior of the chassis, the improvement comprising:
   a fan tray assembly received in the chassis, the fan tray assembly having a plurality of sides, at least one of the sides including a slot for receiving a fan assembly, a first position in which the fan tray assembly is received in the chassis and an extended position in which the fan tray assembly extends from an opening in the chassis, wherein the plurality of fan assemblies are mounted in the fan tray assembly.

2. The improvement of claim 1, wherein the fan tray assembly has an end plate, a left side, and a right side, and at least one of the left and right sides includes the slot for receiving a fan assembly.

3. The improvement of claim 2, wherein the fan assembly is slidably received in the slot.

4. The improvement of claim 3, wherein the fan assembly is electrically connected with a hot tap connection.

5. The improvement of claim 4, further comprising a hot tap board connected to a power cable, the hot tap board mounted to the fan tray assembly.

6. The improvement of claim 3, wherein the chassis opening is in the rear of the chassis and the fan tray assembly extends from the rear of the chassis in the extended position.

7. In a computer chassis including a plurality of fan assemblies for cooling the interior of the chassis, the improvement comprising:

a fan tray assembly received in the chassis, the fan tray assembly having a first position in which the fan tray assembly is received in the chassis the fan tray assembly having a plurality of sides, at least one of the sides including a slot for receiving a fan assembly, and an extended position in which the fan tray assembly extends from an opening in the rear of the chassis in the extended position, wherein the plurality of fan assemblies are mounted in the fan tray assembly.

8. The improvement of claim 7, wherein the chassis opening is substantially centrally located in the chassis rear.

9. A method of removing a fan assembly in a computer chassis including a plurality of fan assemblies for cooling the interior of the chassis, the plurality of fan assemblies installed in a fan tray assembly, the method comprising the steps of:

extending the fan tray assembly from the computer chassis while the computer is running;

removing a fan assembly through a slot in a side of from the fan tray assembly;

installing a fan assembly in the fan tray assembly; and sliding the fan tray assembly into the computer chassis.

10. The method of claim 9, wherein the step of removing the fan assembly comprises sliding the fan assembly out of a fan slot in the fan tray assembly.

11. The method of claim 10, wherein the step of installing the fan assembly comprises sliding the fan assembly in the fan slot and making a hot tap connection.

12. The method of claim 9, wherein the steps of removing and installing the fan assembly comprises sliding the fan assembly in a direction transverse to the direction of movement of the fan tray assembly.

* * * * *